(12) United States Patent
Kollmann et al.

(10) Patent No.: US 9,616,451 B2
(45) Date of Patent: Apr. 11, 2017

(54) APPARATUS FOR PROCESSING WAFER-SHAPED ARTICLES

(71) Applicant: LAM RESEARCH AG, Villach (AT)

(72) Inventors: Mike Daniel Kollmann, St. Gertraud (AT); Christian Thomas Fischer, Arnoldstein (AT); Francisco Camargo, Wolframs-Eschenbach (DE)

(73) Assignee: LAM RESEARCH AG, Villach (AT)

( * ) Notice: Subject to any disclaimer, the term of this patent is extended or adjusted under 35 U.S.C. 154(b) by 1016 days.

(21) Appl. No.: 13/681,074

(22) Filed: Nov. 19, 2012

(65) Prior Publication Data

US 2014/0137908 A1    May 22, 2014

(51) Int. Cl.
  *B05B 15/02*    (2006.01)
  *H01L 21/67*    (2006.01)

(52) U.S. Cl.
  CPC ........ *B05B 15/025* (2013.01); *H01L 21/6715* (2013.01)

(58) Field of Classification Search
  CPC ....... B05B 15/0258; B05B 1/042; B05B 1/20; B05B 7/0012; B05B 7/0441; B05C 11/08; Y10S 134/902
  USPC ...... 118/52, 697, 70, 712; 134/103.2, 104.1, 134/113, 57 R, 902, 95.2, 95.3, 98.1; 239/419.5, 423, 424.5, 463, 589, 599, 602
  See application file for complete search history.

(56) References Cited

U.S. PATENT DOCUMENTS

| | | | | |
|---|---|---|---|---|
| 4,618,101 A | * | 10/1986 | Piggott | ................. B05B 1/042 239/589 |
| 4,903,717 A | | 2/1990 | Sumnitsch | |
| 6,210,481 B1 | * | 4/2001 | Sakai | ...................... B05C 11/08 118/52 |
| 6,536,454 B2 | | 3/2003 | Lindner | |
| 6,659,370 B1 | * | 12/2003 | Inoue | ................... B05B 7/0012 239/419.5 |
| 2011/0130009 A1 | | 6/2011 | Kumnig et al. | |

* cited by examiner

*Primary Examiner* — Karla Moore
*Assistant Examiner* — Tinsae Ayalew

(57) ABSTRACT

The harmful effects of accumulating droplets of process liquid on the outer surface of a dispense nozzle are prevented by equipping an apparatus for process wafer-shaped articles with a blow-off block that blows the droplets off the nozzle outer surface before they can coalesce and drop in an uncontrolled manner onto the work piece. The nozzle preferably has a polished and tapered outer surface to aid in blowing off any accumulated droplets of process liquid from the outer surface.

14 Claims, 3 Drawing Sheets

APPARATUS FOR PROCESSING WAFER-SHAPED ARTICLES

BACKGROUND OF THE INVENTION

1. Field of the Invention

The invention relates to methods and apparatus for treating surfaces of articles, such as semiconductor wafers, using a nozzle for dispensing process liquids onto a surface of the article.

2. Description of Related Art

Semiconductor wafers undergo a variety of wet processing stages during manufacture of integrated circuits, involving the use of various process liquids and gases. For example, when photoresist is to be stripped by a wet process, among the chemical compositions used for that stripping is a solution of sulfuric acid mixed with hydrogen peroxide, often referred to as SPM or "Piranha" etch. Other etching chemistries include SOM (sulfuric acid ozone mixture) processes, as well as mixtures of sulfuric acid and periodic acid as described for example in commonly-owned copending application U.S. Pub. No. 2011/0130009.

SUMMARY OF THE INVENTION

The present inventor has discovered that, when utilizing certain types of chemistries such as those described in the above-noted commonly-owned application, there can be a tendency for small droplets of the process fluid to accumulate on the outer surface of the dispensing nozzle as a result of splashing of the process fluid during processing. Those droplets eventually coalesce, which leads to larger droplets falling downwardly from the nozzle onto the spinning semiconductor wafer in a random manner. These undesired droplets are capable of damages the submicroscopic device features formed in the semiconductor wafer, especially in the worst case when one or more of such droplets falls just after a process has stopped so when no further liquid is being applied through the nozzle.

Thus, in one aspect, the present invention relates to an apparatus for processing a wafer-shaped article, comprising a holder for holding a wafer-shaped article in a predetermined orientation, and a dispense arm with a dispense nozzle for dispensing a fluid onto a wafer-shaped article held by the holder. The dispense arm is movable between at least one dispensing position overlying a wafer-shaped article held by the holder and a standby position. The apparatus further comprises a blow-off block adjacent to the dispense nozzle when the dispense arm is in the standby position, the blow-off block comprising at least one gas discharge opening directed toward an outer surface of the dispense nozzle when the dispense arm is in the standby position, so as to blow off any accumulated liquid droplets from an outer surface of the dispense nozzle.

In preferred embodiments of the apparatus according to the present invention, the outer surface of the dispense nozzle is tapered such that the outer surface is of decreasing radius from an upstream end to an exit end thereof.

In preferred embodiments of the apparatus according to the present invention, the outer surface of the dispense nozzle is polished to promote blowing off of liquid droplets from the outer surface.

In preferred embodiments of the apparatus according to the present invention, the blow-off block is U-shaped so that the dispense nozzle can be received within the blow-off block by being moved laterally into the standby position without vertically moving the dispense nozzle.

In preferred embodiments of the apparatus according to the present invention, the outer surface has a roughness value $R_a$ not greater than 6.3 µm according to DIN ISO 1302, preferably not greater than 3.2 µm, and more preferably not greater than 1.6 µm.

In preferred embodiments of the apparatus according to the present invention, a liquid collector surrounds the holder, the liquid collector comprising a pre-flush block to collect liquid from the dispense nozzle in the standby position, and the blow-off block is mounted on the pre-flush block.

In preferred embodiments of the apparatus according to the present invention, the blow-off block comprises an internal gas conduit leading to the at least one gas discharge opening, the internal gas conduit being downwardly inclined from an upstream end to a downstream end thereof.

In preferred embodiments of the apparatus according to the present invention, the blow-off block comprises a pair of opposing gas discharge openings each communicating with a respective internal gas conduit, and each internal gas conduit is downwardly inclined from an upstream end to a downstream end thereof.

In preferred embodiments of the apparatus according to the present invention, a microcontroller effects a supply of purge gas to the blow-off block upon the dispense arm returning from the at least one dispensing position to the standby position.

In preferred embodiments of the apparatus according to the present invention, the blow-off block comprises a rear wall, opposing side walls joined to the rear wall, and an open front, the open front defining an opening having a width greater than a width of the dispense nozzle, whereby the dispense nozzle fits within the blow-off block between the side walls when the dispense arm is in the standby position.

In preferred embodiments of the apparatus according to the present invention, the holder is a spin chuck in a process module for single wafer wet processing of semiconductor wafers, and the dispense nozzle is positioned relative to the spin chuck so as to dispense a process fluid downwardly onto an upwardly facing surface of the semiconductor wafer in a free flow.

In another aspect, the present invention relates to a nozzle blow-off kit for retrofitting onto an apparatus for processing wafer-shaped articles, comprising a replacement dispense nozzle having an outer surface that is tapered such that the outer surface is of decreasing radius from an upstream end to an exit end thereof, and a blow-off block configured to be mounted to a pre-flush block of an apparatus for processing wafer-shaped articles. The blow-off block comprises at least one gas supply inlet and at least one gas discharge opening, so as to blow off any accumulated liquid droplets from an outer surface of the replacement dispense nozzle. The blow-off block also comprises an opening sized to accept the replacement dispense nozzle in a position wherein the at least one gas discharge opening is directed toward the outer surface of the replacement dispense nozzle.

In preferred embodiments of the kit according to the present invention, the outer surface of the dispense nozzle is polished to promote blowing off of liquid droplets from the outer surface.

In preferred embodiments of the kit according to the present invention, the outer surface has a roughness value $R_a$ not greater than 6.3 µm according to DIN ISO 1302, preferably not greater than 3.2 µm, and more preferably not greater than 1.6 µm.

In preferred embodiments of the kit according to the present invention, the blow-off block comprises an internal gas conduit leading to the at least one gas discharge opening, the internal gas conduit being downwardly inclined from an upstream end to a downstream end thereof.

In preferred embodiments of the kit according to the present invention, the blow-off block comprises a pair of opposing gas discharge openings each communicating with a respective internal gas conduit, and each internal gas conduit is downwardly inclined from an upstream end to a downstream end thereof.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
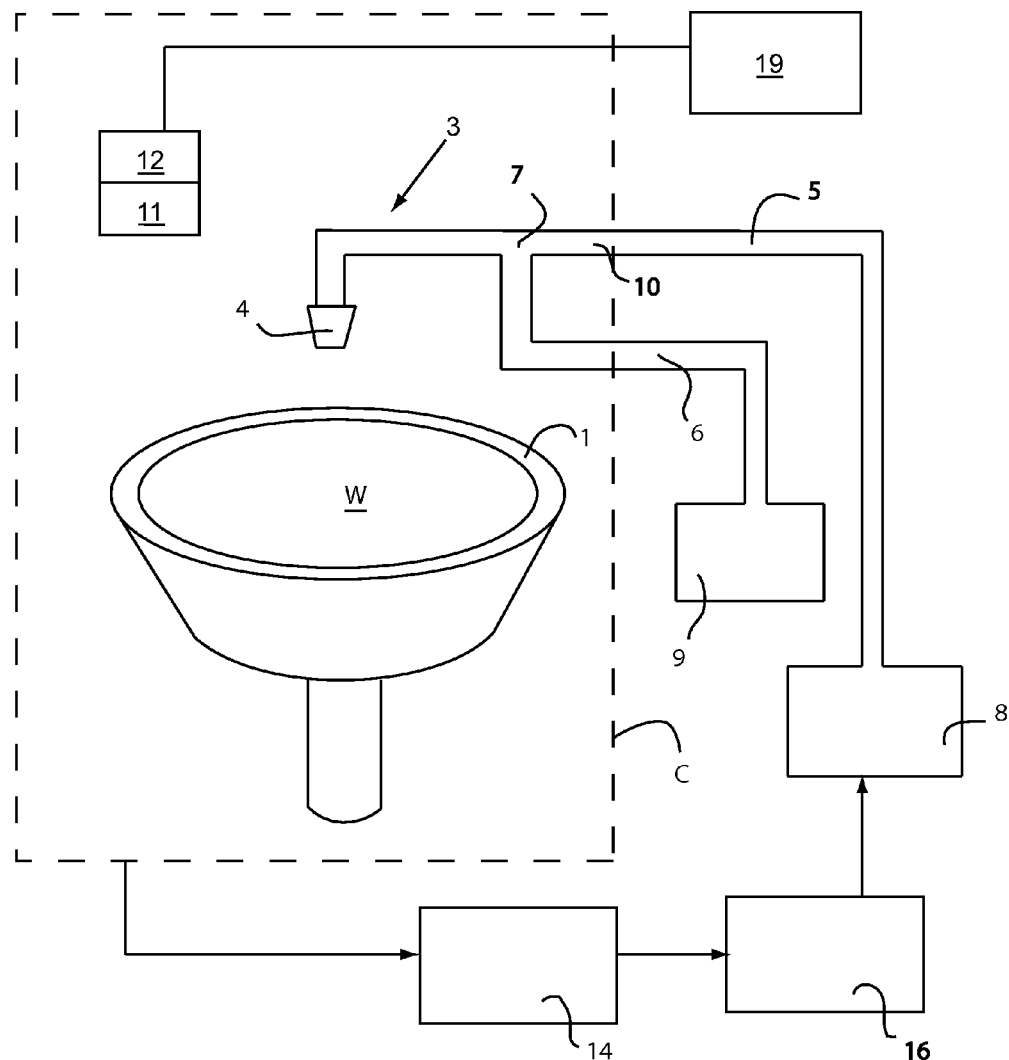
FIG. 1 is a schematic representation of an apparatus for processing wafer-shaped articles according to an embodiment of the invention.

In FIG. 1 a 300 mm diameter semiconductor wafer is held by a spin chuck 1, in a surrounding processing chamber C for single wafer wet processing. Such spin chucks may be designed to operate according to the Bernoulli principle, as described for example in commonly-owned U.S. Pat. No. 4,903,717, or, alternatively, such chuck may support the wafer W via a circular series of gripping pins, as described for example in commonly-owned U.S. Pat. No. 6,536,454.

In this embodiment, a dispenser of treatment fluid comprises a dispense arm 3 with a dispense nozzle 4 configured to dispense the treatment fluid onto the wafer in a free flow.

The treatment fluid is created by combining infeeds of heated inorganic acid, preferably sulphuric acid, and an oxidizing gas, preferably gaseous ozone, from respective feed lines 5 and 6, at a mixing junction 7. The inorganic acid is fed from a liquid supply 8 that is adapted to supply liquid to the mixing station, and the oxidizing gas is fed from a gas supply 9 adapted to supply gas to the mixing station. Dispense nozzle 4 in this embodiment preferably has an outlet orifice whose cross-sectional area is in the range of 3 to 300 mm$^2$, and more preferably 10 to 100 mm$^2$.

Dispense arm 3 is shown in a dispensing position, in which it is situated above the wafer W. As described in greater detail below, dispense arm can be moved to a standby position in which it is situated adjacent a pre-flush block 11 and a blow-off block 12 both of which are shown schematically in FIG. 1. Operations of the apparatus are computer-controlled via microcontroller 19, which in this embodiment actuates the blow-off block 12 to emit jets of inert gas onto the outer surface of the nozzle 4, upon detecting that the dispense arm 3 has returned to the standby position.

The apparatus of this embodiment also includes a fluid collector 14 as is known in the art, wherein the fluid can be collected after being spun off a rotating wafer W, and a gas separator 15 wherein the excess gas is exhausted, as well as a recycling system 16 wherein the remaining liquid is returned to a process tank, from which it can be supplied to the mixing junction 7 where the gas/liquid mixture is prepared.

The wafer W is preferably rotating as the treatment fluid is dispensed onto it, and the rotational speed of the wafer is in the range of 0-1000 rpm, preferably 30-300 rpm, preferably at a speed varying over time.

Figure 2:
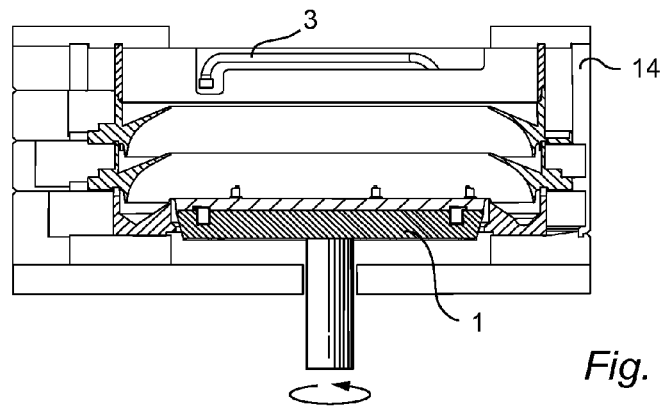
FIG. 2 is a cross-sectional view of an embodiment of the apparatus according to the invention, including a surrounding liquid collector.
Figure 3:
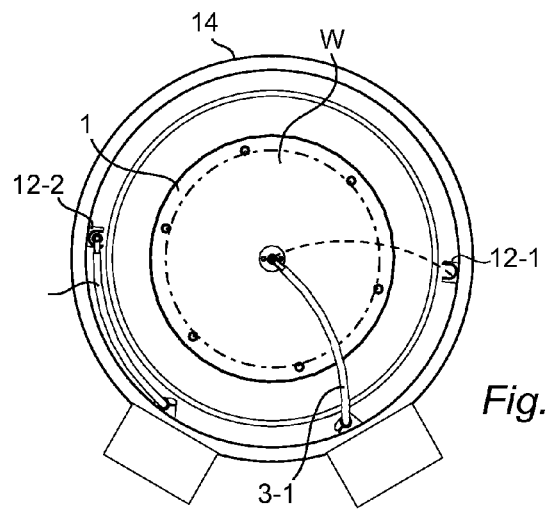
FIG. 3 is a top plan view of the embodiment of FIG. 2.

Dispense arm 3 may be configured to operate as a boom swing, and thus move horizontally relative to and across the rotating wafer, as shown in FIGS. 2 and 3. The speed and range of the boom swing movement is sufficiently wide and fast as to promote an even temperature distribution of the treatment fluid across the wafer surface, thereby to improve uniformity of treatment over a wafer surface.

As can be seen in FIG. 2, the collector 14 may include multiple levels, with the chuck 1 and collector 14 being movable relative to one another along the rotation axis of the chuck 1, so as to position the chuck at each of the levels as desired. This positioning may be accomplished by moving the chuck or by moving the collector 14, for example by means of hydraulic jacks on which the collector is mounted.

In FIG. 3, the apparatus includes two dispense arms 13-1 and 13-2, which are the same in construction but supplied with different process fluids and positioned at different locations about the periphery of the collector 14. Each dispense arm is movable along an arcuate path as shown in broken line in FIG. 3, from a standby position at the periphery of the collector 14 to a range of working positions in which the dispense nozzle 4 is positioned above the wafer W. In the standby position, each dispense arm 3-1, 3-2 is received within a respective blow-off block 12-1, 12-2.

Figure 4:
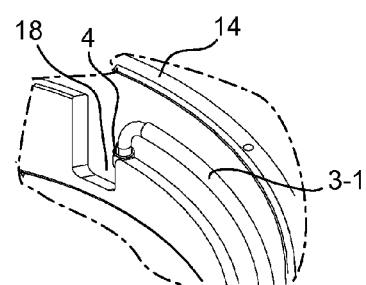
FIG. 4 is a fragmentary perspective view of a dispense arm and nozzle in the standby position.

In the detail of FIG. 4, the dispense arm 3-1 is shown in its standby position, in which the nozzle 4 is directed toward a drain or recirculation channel provided in the collector 14. The blow-off block 12-1 is omitted from this view for ease of understanding.

Figure 5:
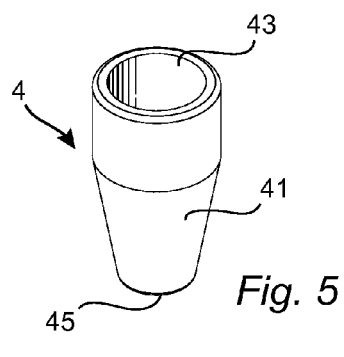
FIG. 5 is a perspective view of a dispense nozzle suitable for use in various embodiments of the present invention.
Figure 6:
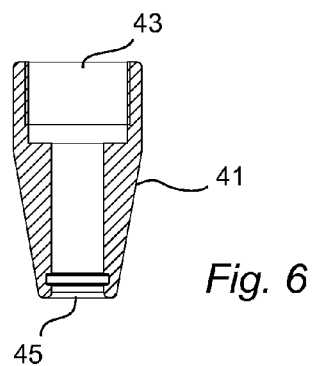
FIG. 6 is an axial sectional view of the nozzle of FIG. 5.

As shown in FIG. 5, the nozzle 4 is provided with a tapered outer surface 41 such that it is of decreasing diameter from an upper end near the inlet opening 43 of nozzle 4 to the outlet orifice 45. However, as can be seen in the axial section of FIG. 6, the interior configuration of the nozzle 4 need not be tapered.

Outer surface 41, in addition to being tapered as described, is preferably also polished, to aid in shedding accumulated liquid droplets together with the gas jets emitted by the blow-off block 12. Nozzle 4 is preferably made of a plastic material that is highly resistant to the corrosive chemicals and high temperatures prevailing in wet processing of semiconductor wafers. Suitable materials include, for example, polytetrafluoroethylene (PTFE), polyetheretherketone (PEEK), polyvinylidene fluoride (PVDF) and polychlorotrifluoroethylene (PCTFE), with PCTFE being particularly preferred.

The polishing of outer surface 41 of nozzle 4 is such as preferably to impart a surface roughness value $R_a$ not greater than 6.3 µm, preferably not greater than 3.2 µm, and more preferably not greater than 1.6 µm, according to DIN ISO 1302, where $R_a$ is the center line average height of a plot of surface roughness according to DIN 4768.

Figure 7:
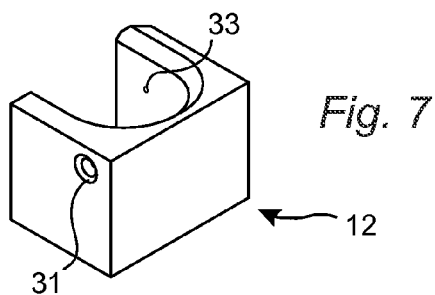
FIG. 7 is a perspective view from above of a blow-off block suitable for use in various embodiments of the present invention.
Figure 8:
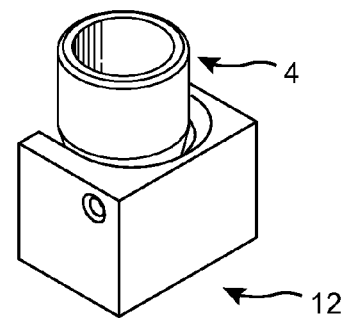
FIG. 8 is a view similar to that of FIG. 7 showing a dispense nozzle in standby position received within the blow-off block.

Preferred embodiments of the blow-off block 12 are shown in FIGS. 7-13, where in FIG. 7 there is visible an inlet opening 31 for attachment of a gas supply line, and a smaller outlet orifice 33 for emitting a jet of gas, preferably an inert gas such as N2, onto the tapered outer surface 41 of nozzle 4. In FIG. 8, it can be seen that nozzle 4 in its standby position fits within the main opening defined by nozzle 4.

Figure 9:
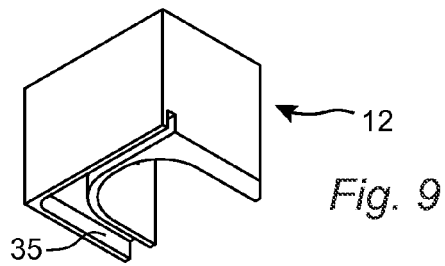
FIG. 9 is a perspective view from below of the blow-off block of FIG. 7.

In FIG. 9, the view from below illustrates that the blow-off block 12 is provided in this embodiment with an L-shaped mounting groove 35 designed so that the blow-off block 12 will readily fit onto a pre-flush block already present at the standby position of the dispense arm 3. A blow-off block 12 as thus designed, together with a replacement nozzle 4 as described previously, can be combined in a kit for use in retrofitting an existing spin chuck having a boom swing dispense arm 3 as described above.

Figure 10:
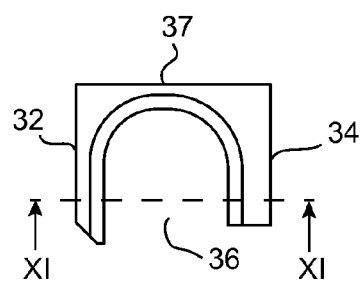
FIG. 10 is a top plan view of the blow-off block of FIG. 7.
Figure 11:
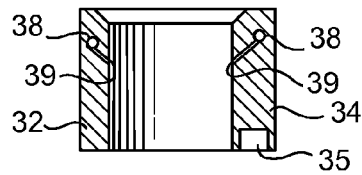
FIG. 11 is a sectional view along the line XI-XI in FIG. 10.

From the top plan view of FIG. 10, it is evident that the blow-off block 12 of this embodiment comprises a pair of opposed side walls 32, 34, joined by a back wall 37, whereas the front of the blow-off block 12 is open at 36 to accommodate the nozzle 4 as it is returned to its standby position. In FIG. 11, it can be seen that the blow-off block 12 is provided with two discharge orifices 39, one in each sidewall 32, 34. Moreover, these orifices communicate with internal conduits 38 that are directed downwardly and generally toward one another.

When gas is supplied to the blow-off block 12, the opposing downward gas jets, together with the shape and smoothness of the nozzle 4, serve to eliminate any liquid droplets that have splashed up onto the outer surface 41 of nozzle 4, before they have time to coalesce and fall onto the wafer undergoing processing.

The blow-off block is also preferably formed of a highly chemical and temperature resistant plastic, examples of which include those described above in connection with the nozzle 4, as well as other plastics such as "natural" polypropylene, that is, polypropylene that is substantially free of fillers, colorants, plasticizers or lubricants.

Figure 12:
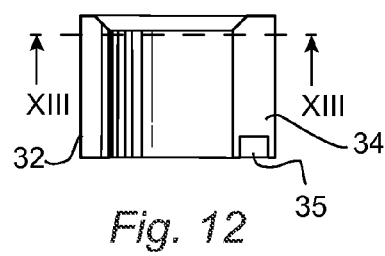
FIG. 12 is a front elevational view of the blow-off block of FIG. 7.
Figure 13:
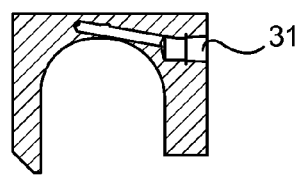
FIG. 13 is a sectional view along the line XIII-XIII in FIG. 12.

Lastly, FIGS. 12 and 13 better illustrate the inlet orifice 31 of the blow-off block 12.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. An apparatus for processing a wafer-shaped article, comprising:
   a holder for holding a wafer-shaped article in a predetermined orientation;
   a dispense arm with a dispense nozzle for dispensing a fluid onto a wafer-shaped article held by the holder, the dispense arm being movable between at least one dispensing position overlying a wafer-shaped article held by the holder and a standby position; and
   a blow-off block adjacent to the dispense nozzle when the dispense arm is in the standby position, the blow-off block comprising at least one gas discharge opening directed toward an outer surface of the dispense nozzle when the dispense arm is in the standby position, so as to blow off any accumulated liquid droplets from an outer surface of the dispense nozzle;
   wherein said blow-off block is U-shaped and comprises a lateral opening that faces a central region of said holder so that said dispense nozzle can be received within said blow-off block by being moved laterally into said standby position without vertically moving said dispense nozzle.

2. The apparatus according to claim 1, wherein said outer surface of said dispense nozzle is tapered such that said outer surface is of decreasing radius from an upstream end to an exit end thereof.

3. The apparatus according to claim 1, wherein said outer surface of said dispense nozzle is polished to promote blowing off of liquid droplets from said outer surface.

4. The apparatus according to claim 1, further comprising a liquid collector surrounding said holder, said liquid collector comprising a pre-flush block to collect liquid from said dispense nozzle in the standby position, and wherein said blow-off block is mounted on said pre-flush block.

5. The apparatus according to claim 1, wherein said blow-off block comprises an internal gas conduit leading to said at least one gas discharge opening, said internal gas conduit being downwardly inclined from an upstream end to a downstream end thereof.

6. The apparatus according to claim 1, wherein said blow-off block comprises a pair of opposing gas discharge openings each communicating with a respective internal gas conduit, and wherein each said internal gas conduit is downwardly inclined from an upstream end to a downstream end thereof.

7. The apparatus according to claim 1, further comprising a microcontroller that effects a supply of purge gas to said blow-off block upon the dispense arm returning from said at least one dispensing position to said standby position.

8. The apparatus according to claim 1, wherein said blow-off block comprises a rear wall, opposing side walls joined to said rear wall, and an open front, said open front defining an opening having a width greater than a width of said dispense nozzle, whereby said dispense nozzle fits within said blow-off block between said side walls when said dispense arm is in the standby position.

9. The apparatus according to claim 1, wherein said holder is a spin chuck in a process module for single wafer wet processing of semiconductor wafers, and wherein said dispense nozzle is positioned relative to said spin chuck so as to dispense a process fluid downwardly onto an upwardly facing surface of the semiconductor wafer in a free flow.

10. A nozzle blow-off kit for retrofitting onto an apparatus for processing wafer-shaped articles, comprising:
    a replacement dispense nozzle having an outer surface that is tapered such that said outer surface is of decreasing radius from an upstream end to an exit end thereof; and
    a blow-off block configured to be mounted to a pre-flush block of an apparatus for processing wafer-shaped articles, said blow-off block comprising at least one gas supply inlet and at least one gas discharge opening, so as to blow off any accumulated liquid droplets from an outer surface of the replacement dispense nozzle;
    wherein said blow-off block comprises a lateral opening sized to accept said replacement dispense nozzle in a position wherein said at least one gas discharge opening is directed toward said outer surface of said replacement dispense nozzle.

11. The kit according to claim 10, wherein said outer surface of said dispense nozzle is polished to promote blowing off of liquid droplets from said outer surface.

12. The apparatus according to claim 11, wherein said outer surface has a roughness value Ra not greater than 6.3 µm according to DIN ISO 1302, preferably not greater than 3.2 µm, and more preferably not greater than 1.6 µm.

13. The kit according to claim 10, wherein said blow-off block comprises an internal gas conduit leading to said at least one gas discharge opening, said internal gas conduit being downwardly inclined from an upstream end to a downstream end thereof.

14. The kit according to claim 10, wherein said blow-off block comprises a pair of opposing gas discharge openings each communicating with a respective internal gas conduit, and wherein each said internal gas conduit is downwardly inclined from an upstream end to a downstream end thereof.

* * * * *